(12) United States Patent
Kang (10) Patent No.: US 9,301,435 B2
(45) Date of Patent: Mar. 29, 2016

(54) DISPLAY APPARATUS

(75) Inventor: Joon Kang, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 127 days.

(21) Appl. No.: 13/437,425

(22) Filed: Apr. 2, 2012

(65) Prior Publication Data

US 2012/0249402 A1 Oct. 4, 2012

(30) Foreign Application Priority Data

Apr. 1, 2011 (KR) ........................ 10-2011-0030305

(51) Int. Cl.
*H05K 7/20* (2006.01)

(52) U.S. Cl.
CPC ................................. *H05K 7/20972* (2013.01)

(58) Field of Classification Search
CPC ................................................. H05K 7/20972
USPC .......................................... 345/156, 173–184
See application file for complete search history.

(56) References Cited

U.S. PATENT DOCUMENTS

| | | | | |
|---|---|---|---|---|
| 5,991,153 | A | * | 11/1999 | Heady et al. .................. 361/704 |
| 7,215,470 | B2 | * | 5/2007 | Kato et al. ..................... 359/443 |
| 2003/0025868 | A1 | * | 2/2003 | Hiroshima et al. ........... 349/156 |
| 2007/0132905 | A1 | * | 6/2007 | Kim et al. ........................ 349/58 |
| 2008/0100790 | A1 | * | 5/2008 | Kang et al. ..................... 349/161 |
| 2009/0277604 | A1 | * | 11/2009 | Kang et al. ....................... 165/56 |
| 2009/0310059 | A1 | * | 12/2009 | Kim et al. ........................ 349/58 |

| | | | |
|---|---|---|---|
| 2011/0013114 | A1 | 1/2011 | Dunn et al. |
| 2011/0019363 | A1 | 1/2011 | Vahlsing et al. |
| 2011/0310557 | A1 * | 12/2011 | Ooe .............................. 361/692 |

FOREIGN PATENT DOCUMENTS

| | | |
|---|---|---|
| CN | 101714316 A | 5/2010 |
| CN | 101714320 A | 5/2010 |
| EP | 2169454 A2 | 3/2010 |
| JP | 06-202566 A | 7/1994 |
| JP | 2003-162901 A | 6/2003 |
| JP | 2005-181799 A | 7/2005 |
| KR | 10-2007-0036096 A | 4/2007 |
| KR | 10-2009-0022313 A | 3/2009 |
| KR | 1020100077618 A | 7/2010 |
| KR | 200452278 Y1 | 2/2011 |
| KR | 101043506 B1 | 6/2011 |
| WO | 2005/079129 A1 | 8/2005 |
| WO | 2009/065125 A2 | 5/2009 |
| WO | 2010/004810 A1 | 1/2010 |
| WO | 2010/007821 A1 | 1/2010 |

OTHER PUBLICATIONS

International Search Report dated Oct. 16, 2012 from the International Searching Authority in counterpart application No. PCT/KR2012/002320.

(Continued)

*Primary Examiner* — Kumar Patel
*Assistant Examiner* — Insa Sadio
(74) *Attorney, Agent, or Firm* — Sughrue Mion, PLLC (57) ABSTRACT

A display apparatus is provided including a liquid crystal module which displays an image, at least one circuit board which controls the liquid crystal module, and a case which accommodates the liquid crystal module and the at least one circuit board therewithin, wherein the case is sealed such that gas cannot be transmitted therethrough.

17 Claims, 7 Drawing Sheets

(56) References Cited

OTHER PUBLICATIONS

Communication dated Jun. 26, 2015, issued by the European Patent Office in counterpart European Application No. 12764776.6.

Communication dated Jul. 3, 2015, issued by the State Intellectual Property Office of the People's Republic of China in counterpart Chinese Application No. 201280026344.9.

Communication from the Japanese Patent Office dated Sep. 29, 2015 in a counterpart Japanese application No. 2014-502470.

* cited by examiner

DISPLAY APPARATUS

CROSS-REFERENCE TO RELATED APPLICATION

This application claims priority from Korean Patent Application No. 2011-0030305, filed on Apr. 1, 2011 in the Korean Intellectual Property Office, the disclosure of which is incorporated herein by reference.

BACKGROUND

1. Field

Exemplary embodiments relate to a closed type display apparatus installed at an outdoor area.

2. Description of the Related Art

In general, a display apparatus is an apparatus configured to form an image: for example, a television, a monitor for a computer, or a digital information display.

In particular, a Digital Information Display (DID), which is used to provide advertisements and information, accommodates a computer system, including a high performance central processing unit (CPU), and uses a high brightness-liquid crystal module which generates a great amount of heat. In this regard, heat dissipation of the DID is required to ensure the reliability of the DID.

Meanwhile, when the DID is disposed for use in an outdoor area, the DID is sealed to a high degree to prevent alien substances such as moisture and dust from intruding to the inside of a main body of the DID.

However, such a high degree of sealing of the case inhibits air from circulating between the inside and the outside of the case, causing a difficulty in dissipating heat dissipation through air circulation between inside and outside a case.

SUMMARY

One or more exemplary embodiments provide a display apparatus capable of providing a superior cooling performance while satisfying a high degree of sealing requirements.

Additional aspects of the disclosure will be set forth in part in the description which follows and, in part, will be obvious from the description, or may be learned by practice of the disclosure.

According to an aspect of an exemplary embodiment, a display apparatus includes a liquid crystal module, at least one circuit board, a case, a frame and a blower fan. The liquid crystal module includes a liquid crystal panel which displays an image. The at least one circuit board is disposed at a rear side of the liquid crystal module and controls an operation of the liquid crystal panel. The case accommodates the liquid crystal mode and the at least one circuit board therewithin, such that the liquid crystal module and the at least one circuit board are sealed within a main chamber formed by the case. The frame is provided in the chamber to divide the chamber into a first chamber and a second chamber. The blower fan is provided on the frame and allows the flow of gas between the first chamber and the second chamber.

The case includes a front case and a back case. The front case has a front surface and a rear surface that are open. The back case is coupled to the open rear surface of the front case.

The front case includes a first coupling part that is formed along a circumference of the open rear surface such that the back case is coupled to the second front case by means of the first coupling part. The first coupling part and the back case are sealed to each other by means of a first sealing member.

The display apparatus further includes a protection glass disposed at a front side of the liquid crystal module to protect the liquid crystal module.

The front case includes a first front case coupled to a front circumferential side of the protection glass, and a second front case forming a lateral side part of the front case and coupled to the first front case.

The protection glass and the first front case are sealed to each other by means of a second sealing member.

The frame a mold frame having an empty inside.

The frame includes at least two transverse frame parts and at least two longitudinal frame parts each having a length longer than a length of each of the transverse frame parts.

The frame divides the chamber into the first chamber disposed within the frame and the second chamber disposed outside the frame.

The element or elements within the first chamber generate a greater amount of heat than the element or elements within the second chamber.

The frame includes a substrate mounting part which contacts a rear surface of the liquid crystal module, wherein the substrate mounting part comprises at least one opening that exposes the rear surface of the liquid crystal module to the first chamber.

The blower fan includes a first blower fan and a second blower fan. The first blower fan is disposed on a first transverse frame part and directs gas from the first chamber to the second chamber. The second blower fan is disposed on a second transverse frame part and directs gas from the second chamber to the first chamber.

Each of the first blower fan and the second blower fan includes at least one axial fan.

The movement of fluid forms a plurality of loops.

The plurality of loops includes a first loop in which the fluid rotates in a first direction and a second loop in which the fluid rotates in a second direction, opposite the first direction.

The chamber is sealed to a level of IP66 or above.

The case is formed using a metal.

In accordance with an aspect of another exemplary embodiment, a display apparatus includes a front case, a back case, a protection glass, a first sealing member, a second sealing member and a cooling apparatus. The front case includes a plurality of lateral walls and has a front surface and a rear surface which are open. The back case is coupled to the open rear surface of the front case. The protection glass is coupled to the open front surface of the front case. The front case, the back case, and the protection glass together define a main chamber therewithin. A liquid crystal module which displays an image and at least one circuit board which controls an operation of the liquid crystal module are disposed within the main chamber. The first sealing member provides a seal between the front case and the back case. The second sealing member provides a seal between the front case and the protection glass. The cooling apparatus divides the main chamber into a first chamber disposed in a center portion of the main chamber and a second chamber disposed around a periphery of the first chamber, and which circulates gas between the first chamber and the second chamber.

The at least one circuit board is disposed in the first chamber.

The cooling apparatus includes a frame which guides a flow movement of gas within the main chamber, and a blower fan disposed on the frame which generates the flow movement of the gas.

The frame is disposed between a rear surface of the liquid crystal module and a front surface of the back case, wherein the frame contacts the rear surface of the liquid crystal module and the front surface of the back case.

The first chamber and the second chamber are formed between the rear surface of the liquid crystal panel and the front surface of the back case.

A circulation of gas within the display apparatus comprises a first flow direction in which gas moves form the first chamber to the second chamber and a second flow direction in which gas moves from the second chamber to the first chamber.

In accordance with an aspect of another exemplary embodiment, a display apparatus includes a liquid crystal module, at least one circuit board, a case and a cooling apparatus. The liquid crystal module displays an image. The at least one circuit board controls the liquid crystal module. The case accommodates the liquid crystal module and the at least one circuit board therewithin, wherein the case is sealed and prevents a circulation of gas therethrough. The cooling apparatus causes a flow of gas along two loops inside the case.

A surface of the case is subject to a thermal radiation-enhancing coating.

Display apparatuses according to one or more exemplary embodiments enables convection inside a sealed case, so that hot spots are prevented from being locally formed. In addition, the heat generated from a heat-generating body inside the case is easily dissipated to the outside through the case using convection.

Heat generating bodies, including a circuit board, are densely disposed in the center of the case, and blower fans are installed at an upper side and a lower side of the heat-generating bodies, respectively, thereby providing a strong flow movement to the heat generating bodies and improving the cooling efficiency.

In addition, such a configuration allows a liquid crystal module to make contact with the flow movement, so that the liquid crystal module is also cooled as well as the heat-generating bodies.

BRIEF DESCRIPTION OF THE DRAWINGS

These and/or other exemplary aspects and advantages will become apparent and more readily appreciated from the following description of exemplary embodiments, taken in conjunction with the accompanying drawings in which.

DETAILED DESCRIPTION

Reference will now be made in detail to exemplary embodiments, which are illustrated in the accompanying drawings, wherein like reference numerals refer to like elements throughout.

Figure 1:
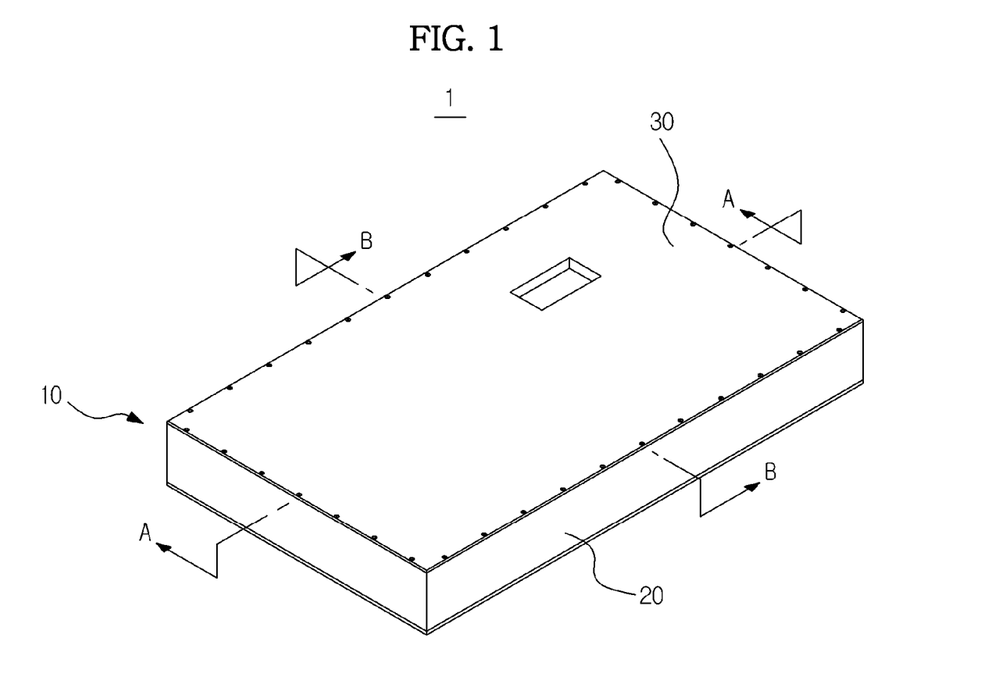
FIG. 1 is a perspective view illustrating a display apparatus according to an exemplary embodiment.
Figure 2:
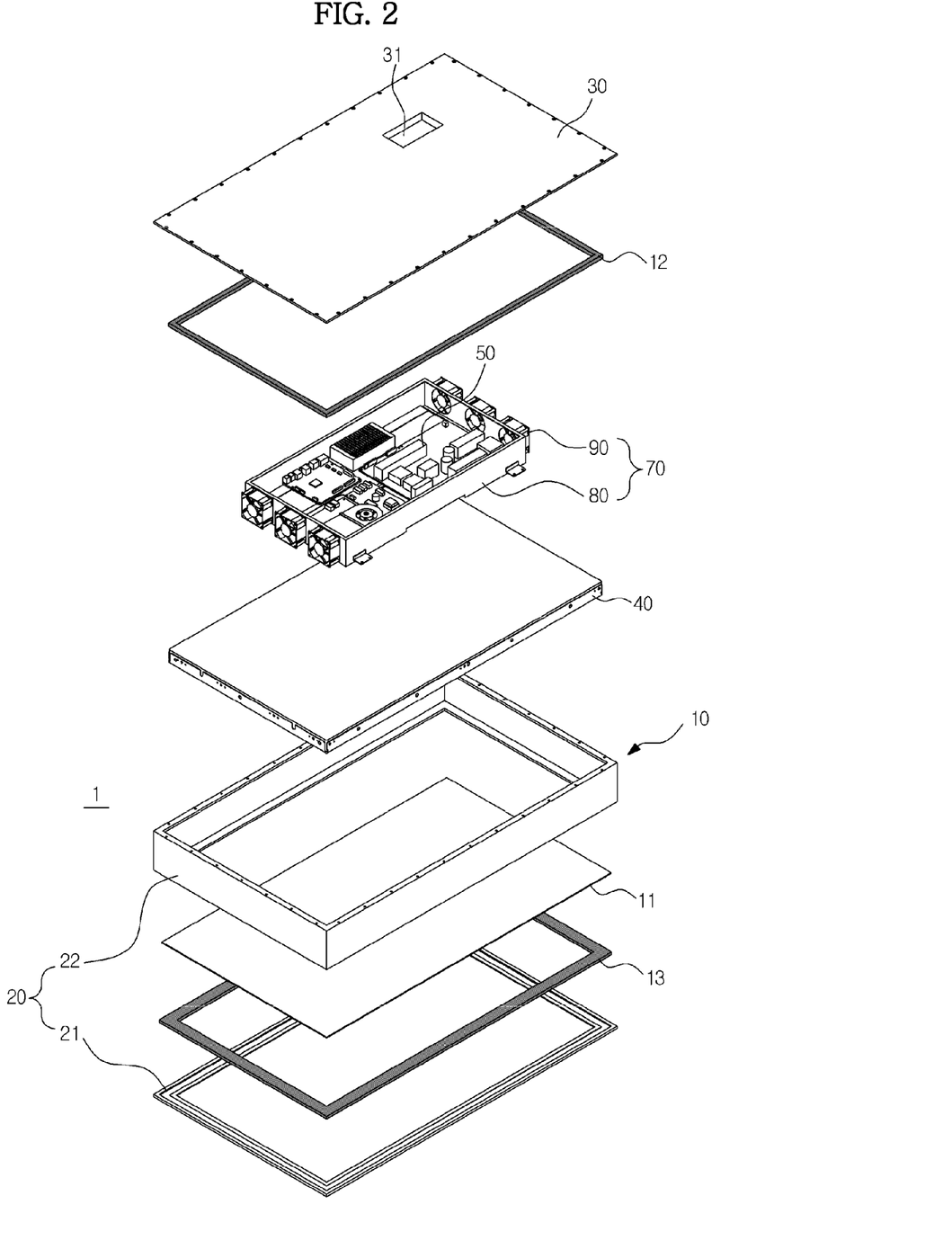
FIG. 2 is an exploded perspective view illustrating the display apparatus of FIG. 1.

FIG. 1 is a perspective view illustrating a display apparatus according to an exemplary embodiment. FIG. 2 is an exploded perspective view illustrating the display apparatus of FIG. 1. In the description of a display apparatus 1 shown in FIGS. 1 and 2 an upper side of the drawings represents a rear surface of the display apparatus 1, and a lower side of the drawings represents a front surface of the display apparatus 1.

Referring to FIGS. 1 and 2, a display apparatus 1 according to an exemplary embodiment includes a liquid crystal module 40 to display an image, a case 10 forming external surfaces of the apparatus 1, a protection glass 11, at least one circuit board 50 to control the liquid crystal module 40, and a cooling apparatus 70 to dissipate heat that is generated from the liquid crystal module 40 and the circuit board 50.

The liquid crystal module 40 includes a liquid crystal panel corresponding to a display area of the display apparatus 1, a backlight unit disposed at a rear surface of the liquid crystal panel to provide light to the liquid crystal panel, and a sash to accommodate and support the liquid crystal panel and the backlight unit. A light source of the backlight unit may be a Cold Cathode Fluorescent Lamp (CCFL), an External Electrode Fluorescent Lamp (EEFL), or a Light Emitting Diode (LED).

At least one circuit board 50 is installed in the display apparatus 1 to provide the liquid crystal module 40 with signals used to operate the liquid crystal module 40. Various control devices, such as a central processing unit (CPU) and a symmetric multiprocessor (SMP), are mounted on the circuit board 50 to perform functions while exchanging information. Such a control device is a heat-generating body.

The at least one circuit board 50 will be described later with reference to FIG. 3 in which the circuit board 50 is shown as installed in a first chamber 61. That is, it will be understood that most of the heat generating bodies are installed in the first chamber 61.

The case 10 accommodates the liquid crystal module 40 and the circuit board 50 and forms an external surface of the display apparatus 1.

The case 10 includes a front case 20, which is provided in the form of an approximate box having a front surface and a rear surface that are open, and a back case 30 which is provided in the form of a plate and is coupled to the open rear surface of the front case 20. Neither the front case 20 nor the back case 30 includes any ventilation through-hole though which air can pass between the inside and the outside of the case 10. Thus, the front case 20, the back case 30, and the protection glass 11 together, seal the inside of the case 10. The back case 30 may be provided with a waterproof connector accommodating part 31 through which a water proof connector is connected.

The front case 20 includes a first front case 21, which is coupled to a front circumferential portion of the protection glass 11, and a second front case 22, which is coupled to the first front case 21 and to the rear case 30 and forms a lateral side part of the front case 20. The protection glass 11 is configured to protect the liquid crystal panel.

Figure 7:
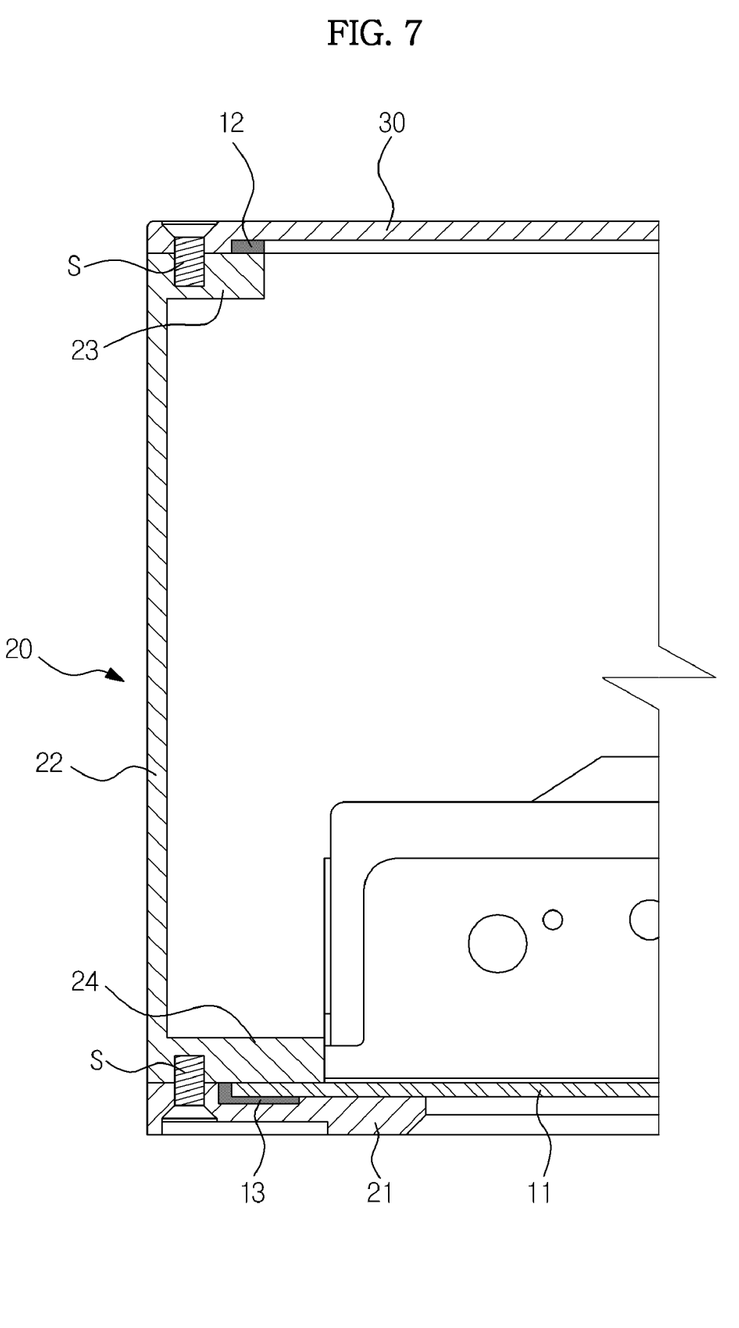
FIG. 7 is an enlarged view of a portion of FIG. 6.

Referring to FIG. 7, the second front case 22 is provided with a first coupling part 23 formed along a circumference of the open rear surface of the front case 20 such that the second front case 22 is coupled to the back case 30 via the first coupling part. The first coupling part 23 and the back case 30 are securely coupled to each other through a fastening member (S). A first sealing member 12 formed using rubber, or another suitable material, is interposed between the first coupled part 23 and the back case 30 such that the first coupling part 23 and the back case 30 are sealed to each other.

In addition, the second front case 22 is further provided with a second coupling part 24 formed along a circumference of the open front surface of the front case 20 such that the second front case 22 is coupled to the first front case 21 via the second coupling part 24. The second coupling part 24 and the first front case 21 are securely coupled to each other through a fastening member (S).

The protection glass 11 is inserted and fixed between the first front case 21 and the second coupling part 24. In addition, a second sealing member 13 which is formed using rubber, or another suitable material, is interposed between the protection glass 11 and the first front case 21 such that the protection glass 11 and the first front case 21 are sealed to each other.

Such a configuration enables the inside of the case 10 to be sealed to a high degree. In particular, such a configuration enables the inside of the case 10 to be sealed with a rating of IP66 or above according to International Standards regarding the degree of protection of an enclosure against the intrusion of water and solid objects.

Meanwhile, according this exemplary embodiment, the heat inside the case 10 is dissipated to the outside while being transmitted through the case 10. Accordingly, the case 10 is formed using a metal having a high thermal conductivity. In addition, the surface of the case 10 may be subjected to a thermal radiation-enhancing coating which increases the amount of heat radiation and enhances the cooling efficiency.

Referring again to FIG. 2, the cooling apparatus 70 of the display apparatus 1 includes a blower fan 90 configured to generate a flow movement of air and a frame 80 configured to guide the flow movement of the air.

The cooling apparatus 70 is disposed on a sealed space inside the case 10. The sealed space represents a space that is formed by the rear surface of the liquid crystal module 40, the front surface of the back case 30, and inner side surfaces of the front case 20. Hereinafter, the sealed space is referred to as a chamber (denoted as reference numeral 60 in FIG. 3). As described above, the chamber 60 is a space sealed to a high degree. The description of the cooling apparatus 70 will be made later in detail.

Figure 3:
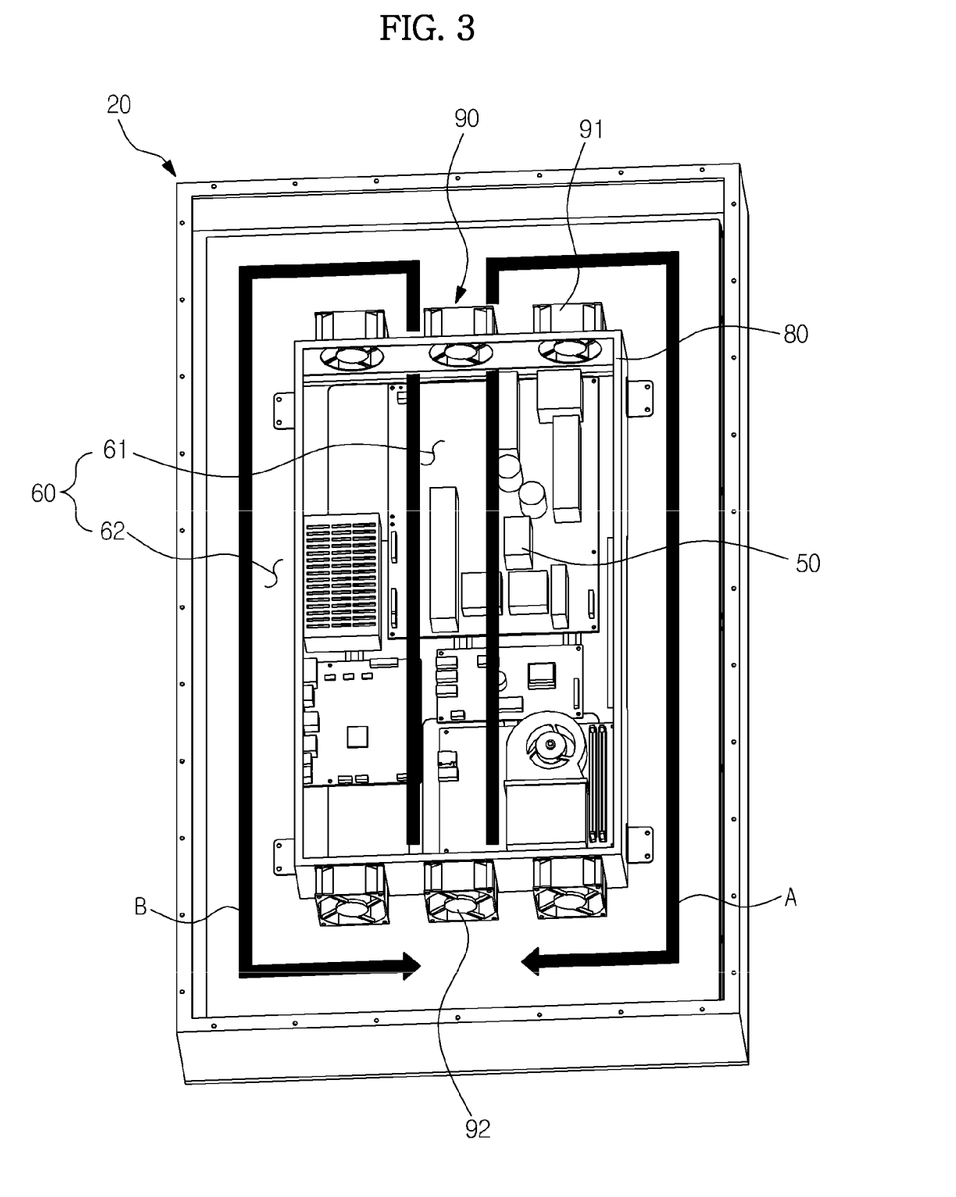
FIG. 3 is a view used to explain a cooling structure of the display apparatus of FIG. 1.
Figure 4:
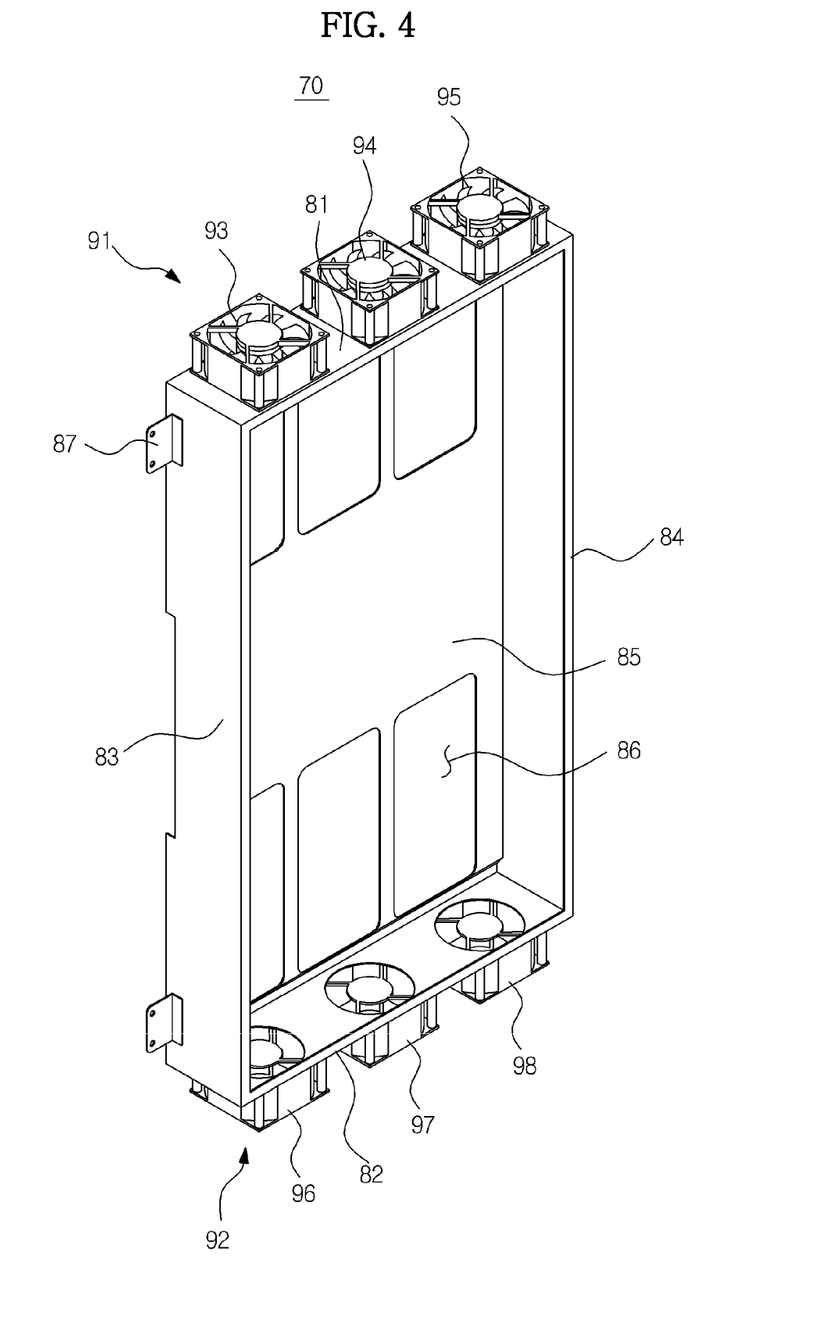
FIG. 4 is a view illustrating a cooling apparatus of the display apparatus of FIG. 1.
Figure 5:
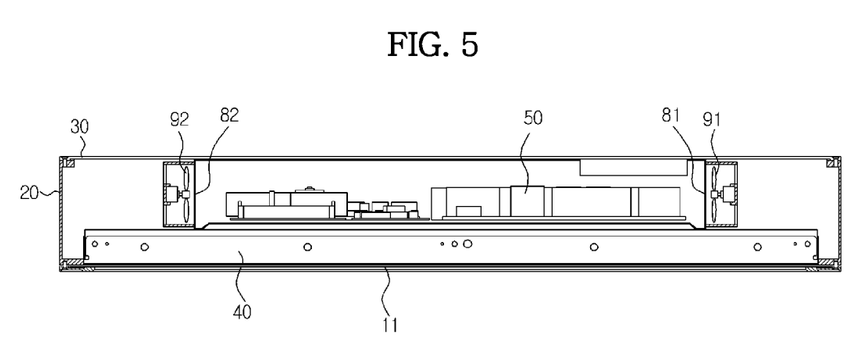
FIG. 5 is a cross sectional view taken along line A-A of FIG. 1.
Figure 6:
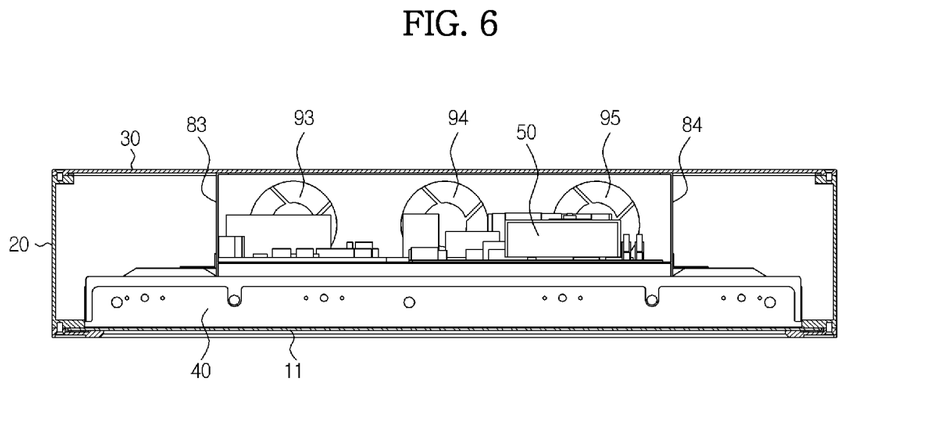
FIG. 6 is a cross sectional view taken along line B-B of FIG. 1.

FIG. 3 is a view used to explain a cooling structure of the display apparatus of FIG. 1. FIG. 4 is a view illustrating a cooling apparatus of the display apparatus of FIG. 1. FIG. 5 is a cross-sectional view taken along line A-A of FIG. 1. FIG. 6 is a cross-sectional view taken along line B-B of FIG. 1.

Referring to FIGS. 1 to 6, the frame 80 is disposed in the chamber 60 to divide the chamber 60 into a first chamber 61, within the frame 80, and a second chamber 62, outside of the frame 80.

Meanwhile, in order to allow the amount of heat generation of the first chamber 61 to be larger than that of the second chamber 62, most of the at least one circuit board 50 is disposed in the first chamber 61. Such a disposition provides a benefit to intensively cool off the heat-generating bodies gathered in the first chamber 61, and the cooling efficiency is enhanced.

The frame 80 is provided in the form of a mold frame having an open front surface and an empty inside. The frame 80 includes two transverse frame parts 81 and 82 and two longitudinal frame parts 83 and 84, the four frame parts 81, 82, 83 and 84 forming lateral side parts of the frame 80. According to this embodiment, each of the longitudinal frame parts 83 and 84 has a length longer than that of each of the transverse frame parts 81 and 82.

Each of the longitudinal frame parts 84 and 84A is provided at an outer side thereof with a plurality of liquid crystal module coupling parts 87 that have coupling holes and are configured to couple the frame 80 to the liquid crystal module 40.

The transverse frame parts 81 and 82 and the longitudinal frame parts 83 and 84 are disposed between the rear surface of the liquid crystal module 40 and the front surface of the back case 30 such that air, or another gas, inside the first chamber 61 is isolated from air inside the second chamber 62. The transverse frame parts 81 and 82 and the longitudinal frame parts 83 and 84 come into close contact with the rear surface of the liquid crystal module 40 and the front surface of the back case 30.

Meanwhile, a substrate mounting part 85 is provided in the frame 80. The substrate mounting part 85 is provided in the form of a plate while being adjacent to the rear surface of the liquid crystal module 40.

The substrate mounting part 85 has an opening 86 that exposes the rear surface of the liquid crystal module 40 to dissipate heat generated from the liquid crystal module 40 into the first chamber 61. Such a configuration allows the liquid crystal module 40 to make contact with the flow movement of air when the blower fan 90 operates, so that the liquid crystal module 40 is cooled off together with the circuit board 50.

The blower fan 90 is configured to convect air inside the chamber 60. The air flow movement generated by the blower fan 90 is circulated between the first chamber 61 and the second chamber 62 while being guided by the frame 80. Such a flow movement enables the air to absorb heat from the circuit board 50 in the first chamber 61 and dissipate the absorbed heat to the base case 30 in the second chamber 62, thereby cooling the display apparatus 1. That is, the air flow movement generated by the blower fan 90 includes a first flow movement to absorb heat from the circuit board 50 and a second flow movement to dissipate the absorbed heat to the back case 30.

The blower fan 90 may include a plurality of blower fans. According to this example, the blower fan 90 includes a first blower fan 91 and a second blower fan 92 to increase the flow movement and enhance the cooling efficiency.

The first blower fan 91 is provided on the transverse frame 81 to move air from the first chamber 61 to the second chamber 62. The second blower fan 92 is provided on the transverse frame 82 to move air from the second chamber 62 to the first chamber 61.

The blower fan 90 is provided in the form of an axial fan that moves a air in an axial direction. The first blower fan 91 includes three axial fans 93, 94, and 95, and the second blow fan 92 includes three axial fans 96, 97, and 98. The number of axial fans included in each of the first blow fan 91 and the second blower fan 92 may vary.

The air inside the chamber 60 circulates between the first chamber 61 and the second chamber 62 through the blower fan 90, and in particular, circulates along two loops including loop A and loop B, as shown in FIG. 3. Air flow movement of the loop A is formed to rotate in opposition direction to air flow movement of the loop B. As described above, the cooling apparatus 70 forms two circulation loops inside the chamber 60, so that the display apparatus 1 is effectively prevented from being locally overheated and also the interior and the surface of the display apparatus 1 maintain even temperature distribution.

Although exemplary embodiments have been shown and described, it would be appreciated by those skilled in the art that changes may be made in these embodiments without departing from the principles and spirit of the inventive concept, the scope of which is defined in the claims and their equivalents.

What is claimed is:
1. A display apparatus comprising:
 a liquid crystal module comprising a liquid crystal panel which displays an image;
 at least one circuit board, disposed at a rear side of the liquid crystal module, which controls an operation of the liquid crystal panel;

a case which accommodates the liquid crystal module and the at least one circuit board, such that the liquid crystal module and the at least one circuit board are sealed within a main chamber formed by the case;

a frame, disposed in the main chamber, which divides the main chamber into a first chamber and a second chamber; and a blower fan disposed on the frame, which allows gas to circulate between the first chamber and the second chamber, wherein the frame comprises a substrate mounting part which contacts a rear surface of the liquid crystal module, wherein the substrate mounting part comprises at least one opening that exposes the rear surface of the liquid crystal module within the first chamber.

2. The display apparatus of claim 1, wherein the case comprises:

a front case comprising a plurality of lateral walls and having a front surface and a rear surface that are open; and a back case coupled to the open rear surface of the front case.

3. The display apparatus of claim 2, wherein the front case comprises a first coupling part that is formed along a circumference of the open rear surface, wherein the back case is coupled to the front case by means of the first coupling part, and wherein the first coupling part and the back case are sealed to each other by means of a first sealing member.

4. The display apparatus of claim 1, further comprising a protection glass disposed on a front side of the liquid crystal module to protect the liquid crystal module.

5. The display apparatus of claim 4, wherein the case comprises:

a front case having a front surface and a rear surface that are open, the front case comprising a first front case coupled to a front circumference of the protection glass, and a second front case, forming a lateral side part of the front case, coupled to the first front case; and a back case coupled to the open rear surface of the front case.

6. The display apparatus of claim 5, further comprising a second sealing member, wherein the protection glass and the first front case are sealed to each other by means of the second sealing member.

7. The display apparatus of claim 1, wherein the frame comprises a mold frame.

8. The display apparatus of claim 7, wherein the frame comprises:

at least two transverse frame parts; and at least two longitudinal frame parts, wherein a length of each of the longitudinal frame parts is greater than a length of each of the transverse frame parts.

9. The display apparatus of claim 8, wherein the blower fan comprises:

a first blower fan, disposed on a first transverse frame part, which guides gas from the first chamber into the second chamber; and a second blower fan, disposed on a second transverse frame part, which guides gas from the second chamber into the first chamber.

10. The display apparatus of claim 9, wherein each of the first blower fan and the second blower fan comprises at least one axial fan.

11. The display apparatus of claim 1, wherein the frame divides the main chamber into the first chamber disposed within the frame and the second chamber disposed outside the frame.

12. The display apparatus of claim 1, wherein elements disposed within the first chamber generate a greater amount of heat than elements disposed within the second chamber.

13. The display apparatus of claim 1, wherein a circulation of gas within the display apparatus forms a plurality of loops.

14. The display apparatus of claim 13, wherein the plurality of loops comprises a first loop in which gas rotates in a first direction and a second loop in which gas rotates in a second direction opposite the first direction.

15. The display apparatus of claim 1, wherein the chamber is sealed to a level of IP66 or above.

16. The display apparatus of claim 1, wherein the case is formed of a metal.

17. A display apparatus housing comprising:

a case defining a main chamber therewithin, the case comprising:

a front case comprising a plurality of lateral walls and having a front surface and a rear surface which are open, a back case coupled and sealed to the open rear surface of the front case, and a protection glass coupled and sealed to the open front surface of the front case; and a cooling apparatus comprising:

a frame which divides the main chamber into a first chamber disposed within the frame, and a second chamber disposed outside the frame, wherein the frame comprises at least a first transverse part and a second transverse frame part, and at least one blower which causes a closed circulation of air between a first loop flowing through the first chamber and a second loop flowing through the second chamber, wherein the blower comprises:

a first blower fan, disposed on the first transverse frame part, which guides air from the first chamber into the second chamber, and a second blower fan, disposed on the second transverse frame part, which guides air from the second chamber into the first chamber.

* * * * *